United States Patent
Kaneko et al.

(10) Patent No.: US 7,563,043 B2
(45) Date of Patent: Jul. 21, 2009

(54) COATING/DEVELOPING APPARATUS AND SUBSTRATE TRANSFER METHOD

(75) Inventors: Tomohiro Kaneko, Koshi (JP); Akira Miyata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 11/877,324

(22) Filed: Oct. 23, 2007

(65) Prior Publication Data

US 2008/0117390 A1 May 22, 2008

(30) Foreign Application Priority Data

Nov. 22, 2006 (JP) ............... 2006-314934

(51) Int. Cl.
- G03D 5/00 (2006.01)
- B05C 11/00 (2006.01)
- G03B 27/32 (2006.01)
- G06F 19/00 (2006.01)

(52) U.S. Cl. .................. 396/611; 355/27; 118/696; 414/935; 700/121

(58) Field of Classification Search ............... 396/611; 355/27; 414/935; 118/696; 700/100, 112, 700/121

See application file for complete search history.

(56) References Cited

U.S. PATENT DOCUMENTS 6,126,703 A * 10/2000 Akimoto et al. ............ 29/25.01
6,916,429 B2 * 7/2005 Kool et al. ................ 216/104
7,008,124 B2 3/2006 Miyata
7,379,785 B2 * 5/2008 Higashi et al. ............. 700/112
2006/0231206 A1 10/2006 Nagasaka et al.

FOREIGN PATENT DOCUMENTS

JP 2004-143597 5/2004
JP 2004-193597 7/2004

* cited by examiner

Primary Examiner—Alan A Mathews
(74) Attorney, Agent, or Firm—Oblon, Spivak, McClelland, Maier & Neustadt, P.C.

(57) ABSTRACT

In a coating/developing apparatus, a process section includes post-exposure baking units each having a waiting position and configured to perform a baking process on a substrate. An interface section transfer mechanism includes a first transfer mechanism configured to transfer the substrate to and from the process section and to load the substrate into the post-exposure baking units, and a second transfer mechanism configured to transfer the substrate to and from the light exposure apparatus. An interface section includes a relay position configured to place thereon the substrate transferred by the second transfer mechanism, and to allow the first transfer mechanism to receive the substrate therefrom. A control section is arranged to set the substrate on standby at the relay position and the waiting position, to make a time period constant among substrates from an end of the light exposure process to a start of a post-exposure baking process.

21 Claims, 9 Drawing Sheets

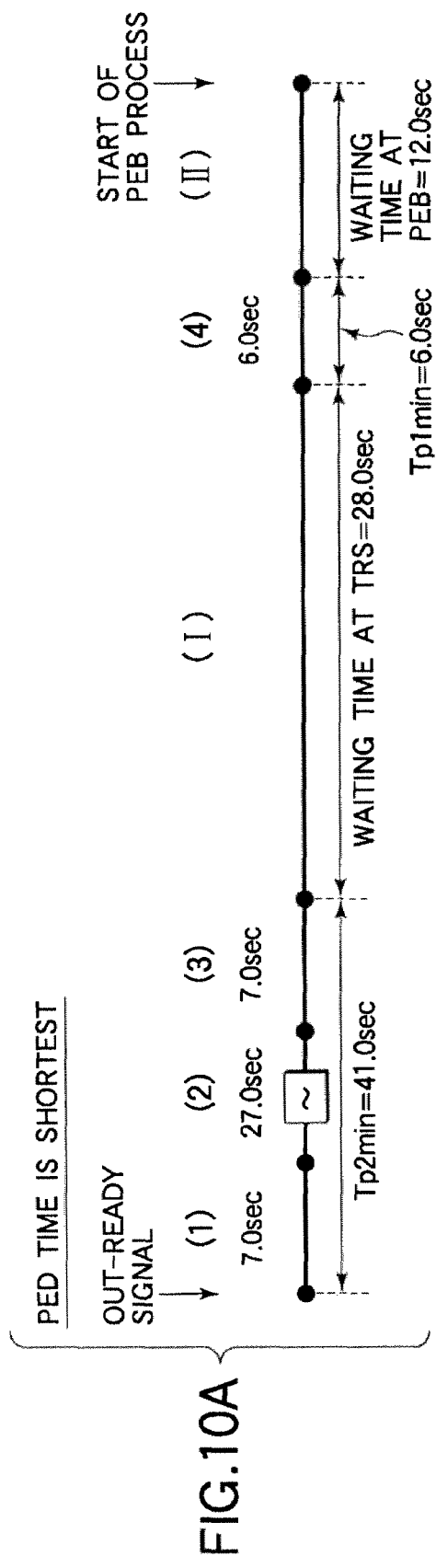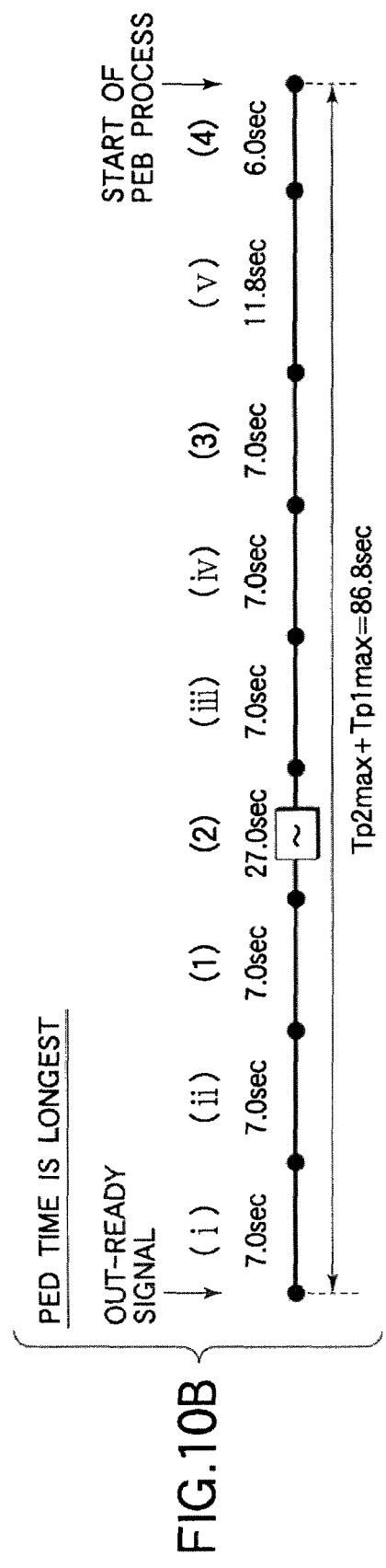

COATING/DEVELOPING APPARATUS AND SUBSTRATE TRANSFER METHOD

BACKGROUND OF THE INVENTION

1. Field of the Invention

The present invention relates to a coating/developing apparatus and a substrate transfer method, in which a resist film is formed by applying a resist liquid to a substrate, and is then subjected to a light exposure process by a light exposure apparatus and a subsequent developing process. Particularly, the present invention relates to a coating/developing apparatus and a substrate transfer method preferably used for an immersion light exposure apparatus for performing light exposure while immersing the resist film in a liquid.

2. Description of the Related Art

In the process of manufacturing semiconductor devices, photolithography techniques are used for forming circuit patterns on semiconductor wafers (which will be simply referred to as "wafer", hereinafter). Where a circuit pattern is formed by use of photolithography, the process steps are performed, as follows. Specifically, a resist liquid is first applied to a wafer to form a resist film. Then, the resist film is irradiated with light to perform light exposure on the resist film in accordance with the circuit pattern. Then, the resist film is subjected to a developing process. Such photolithography steps are performed in a system including a coating/developing apparatus for performing a series of processes, such as resist coating and development after light exposure, combined with a light exposure apparatus.

In recent years, since patterns are increasingly miniaturized, resists of the chemical amplification type are used, because they have higher sensitivity. Where a resist of the chemical amplification type is used, a heating process is performed thereon by a post-exposure baking unit (PEB) after light exposure to promote the reaction. However, since the reaction proceeds in a time period from the light exposure to the heating process, if the time period from the end of the light exposure to the start of the heating process performed by the post-exposure baking unit (PEB) is fluctuated, the uniformity of line width becomes poor. Accordingly, this time period should be constant. In this respect, an interface section of the coating/developing apparatus relative to the light exposure apparatus includes a transfer arm to transfer semiconductor wafers. The transfer arm is used not only for transfer from the light exposure apparatus into the post-exposure baking unit (PEB), but also for transfer in other various steps. Consequently, the time period from the end of the light exposure to the start of the heating process performed by the post-exposure baking unit is inevitably fluctuated among wafers depending on the situation of the transfer arm.

As a technique for preventing this problem, Jpn. Pat. Appln. KOKAI Publication No. 2004-193597 discloses a technique for setting a post-exposure delay time, which is defined by the time period from the end of a light exposure performed by a light exposure apparatus to the start of a heating process performed by a post-exposure baking unit, to be constant among wafers. For this purpose, each wafer is set on standby in an unheated state inside the post-exposure baking unit (PEB) during a waiting time Tt expressed by Tt=Tmax+Tmin−Tr, where Tmax is the maximum value of a transfer start delay time, Tmin is the shortest time thereof, and Tr is the actual transfer time. With this operation, the time period from the end of the light exposure performed by the light exposure apparatus to the start of the heating process performed by the post-exposure baking unit is made constant among all the wafers.

In recent years, the integration degree of semiconductor devices becomes increasingly higher to improve the operation speed and so forth. Accordingly, photolithography techniques are required to increase the miniaturization level of circuit patterns formed on wafers. As a photolithography technique for realizing a high resolution of a 45-nm node level, there has been proposed the following immersion light exposure (for example, see U.S. Patent Application Publication No. US 2006/0231206 A1). In this immersion light exposure, a light exposure liquid, such as purified water, having a refractive index higher than air is supplied between the wafer and light exposure projection lens. The wavelength of light radiated from the projection lens is shortened by means of the refractive index of the light exposure liquid, so that the line width obtained by the light exposure is decreased.

In the immersion light exposure, the wafer is unloaded from the light exposure apparatus in a wet state, and this wet wafer is returned to the coating/developing apparatus. Accordingly, in order to prevent problems, such as formation of water marks on wafers, from being caused, a cleaning/drying process needs to be performed in the interface section.

Where an immersion light exposure is performed, therefore, a cleaning/drying process time is added to the transfer waiting time described above in the interface section, from the end of light exposure to the start of the post-exposure baking, resulting in that the maximum value of the transfer start delay time is very large.

As described above, where an immersion light exposure process is performed by the method disclosed in Jpn. Pat. Appln. KOKAI Publication No. 2004-193597 described above, and the post-exposure delay time is made constant among wafers, the waiting time of a wafer in the post-exposure baking unit (PEB) is increased. In this case, in order to maintain the same throughput, the number of post-exposure baking units (PEB) in the coating/developing apparatus needs to be larger. However, since post-exposure baking units (PEB) are expensive, a preferable method should be arranged such that the time period until the post-exposure baking process can be made constant without increasing the necessary number of units.

BRIEF SUMMARY OF THE INVENTION

An object of the present invention is to provide a coating/developing apparatus and a substrate transfer method, suitably applied to immersion light exposure, which can make the post-exposure delay time constant among wafers without increasing the number of post-exposure baking units.

According to a first aspect of the present invention, there is provided a coating/developing apparatus for applying a resist liquid onto a substrate to form a resist film, and performing a developing process on the resist film after a light exposure process is performed thereon by a light exposure apparatus, the coating/developing apparatus comprising: a process section including a plurality of processing units configured to perform a series of processes for resist coating and development; an interface section disposed between the process section and the light exposure apparatus, and configured to transfer the substrate to and from the light exposure apparatus; a main transfer mechanism configured to transfer the substrate in the process section; an interface section transfer mechanism configured to transfer the substrate in the interface section; and a control section configured to control transfer of the substrate, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, the interface section further includes a relay position configured to place thereon the substrate transferred by the second transfer mechanism, and to allow the first transfer mechanism to receive the substrate therefrom, and the control section is arranged to set the substrate on standby at the relay position and the waiting position of each post-exposure baking unit, so as to make a time period constant among substrates from an end of the light exposure process performed by the light exposure apparatus to a start of a post-exposure baking process performed by the post-exposure baking unit.

According to a second aspect of the present invention, there is provided a coating/developing apparatus for applying a resist liquid onto a substrate to form a resist film, and performing a developing process on the resist film after an immersion light exposure process is performed thereon by an immersion light exposure apparatus, which is configured to perform light exposure while immersing the resist film in a liquid, the coating/developing apparatus comprising: a process section including a plurality of processing units configured to perform a series of processes for resist coating and development; an interface section disposed between the process section and the light exposure apparatus, configured to transfer the substrate to and from the light exposure apparatus, and including a cleaning unit for cleaning the substrate after the immersion light exposure process; a main transfer mechanism configured to transfer the substrate in the process section; an interface section transfer mechanism configured to transfer the substrate in the interface section; and a control section configured to control transfer of the substrate, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus and to load and unload the substrate to and from the cleaning unit, the interface section further includes a relay position configured to place thereon the substrate transferred by the second transfer mechanism, and to allow the first transfer mechanism to receive the substrate therefrom, and the control section is arranged to set the substrate on standby at the relay position and the waiting position of each post-exposure baking unit, so as to make a time period constant among substrates from an end of the light exposure process performed by the light exposure apparatus to a start of a post-exposure baking process performed by the post-exposure baking unit.

According to a third aspect of the present invention, there is provided a substrate transferring method for transferring a light-exposed substrate into a post-exposure baking unit in a coating/developing apparatus for applying a resist liquid onto a substrate to form a resist film, and performing a developing process on the resist film after a light exposure process is performed thereon by a light exposure apparatus, the coating/developing apparatus comprising a process section including a plurality of processing units configured to perform a series of processes for resist coating and development, an interface section disposed between the process section and the light exposure apparatus, and configured to transfer the substrate to and from the light exposure apparatus, a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, and the interface section further includes a relay position configured to place thereon the substrate transferred by the second transfer mechanism, and to allow the first transfer mechanism to receive the substrate therefrom, the method comprising: performing transfer of the substrate toward one of the post-exposure baking units after the substrate is subjected to the light exposure process by the light exposure apparatus; and setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

According to a fourth aspect of the present invention, there is provided a substrate transferring method for transferring a light-exposed substrate into a post-exposure baking unit in a coating/developing apparatus for applying a resist liquid onto a substrate to form a resist film, and performing a developing process on the resist film after an immersion light exposure process is performed thereon by an immersion light exposure apparatus, which is configured to perform light exposure while immersing the resist film in a liquid, the coating/developing apparatus comprising a process section including a plurality of processing units configured to perform a series of processes for resist coating and development, an interface section disposed between the process section and the light exposure apparatus, configured to transfer the substrate to and from the light exposure apparatus, and including a cleaning unit for cleaning the substrate after the immersion light exposure process, and a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus and to load and unload the substrate to and from the cleaning unit, and the interface section further includes a relay position configured to place thereon the substrate transferred by the second transfer mechanism, and to allow the first transfer mechanism to receive the substrate therefrom, the method comprising: performing transfer of the substrate toward one of the post-exposure baking units after the substrate is subjected to the light exposure process by the light exposure apparatus; and setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

According to a fifth aspect of the present invention, there is provided a storage medium that stores a computer program for transferring a light-exposed substrate into a post-exposure baking unit in a coating/developing apparatus for applying a resist liquid onto a substrate to form a resist film, and performing a developing process on the resist film after a light exposure process is performed thereon by a light exposure apparatus, the coating/developing apparatus comprising a process section including a plurality of processing units configured to perform a series of processes for resist coating and development, an interface section disposed between the process section and the light exposure apparatus, and configured to transfer the substrate to and from the light exposure apparatus, a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, and the interface section further includes a relay position configured to place thereon the substrate transferred by the second transfer mechanism, and to allow the first transfer mechanism to receive the substrate therefrom, the computer program, when executed, causing the computer to control the first and second transfer mechanisms to execute: performing transfer of the substrate toward one of the post-exposure baking units after the substrate is subjected to the light exposure process by the light exposure apparatus; and setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10A is a time chart showing a PED time management in a case where the PED time is shortest; and FIG. 10B is a time chart showing a PED time management in a case where the PED time is longest.

DETAILED DESCRIPTION OF THE INVENTION

An embodiment of the present invention will now be described with reference to the accompanying drawings.

Figure 1:
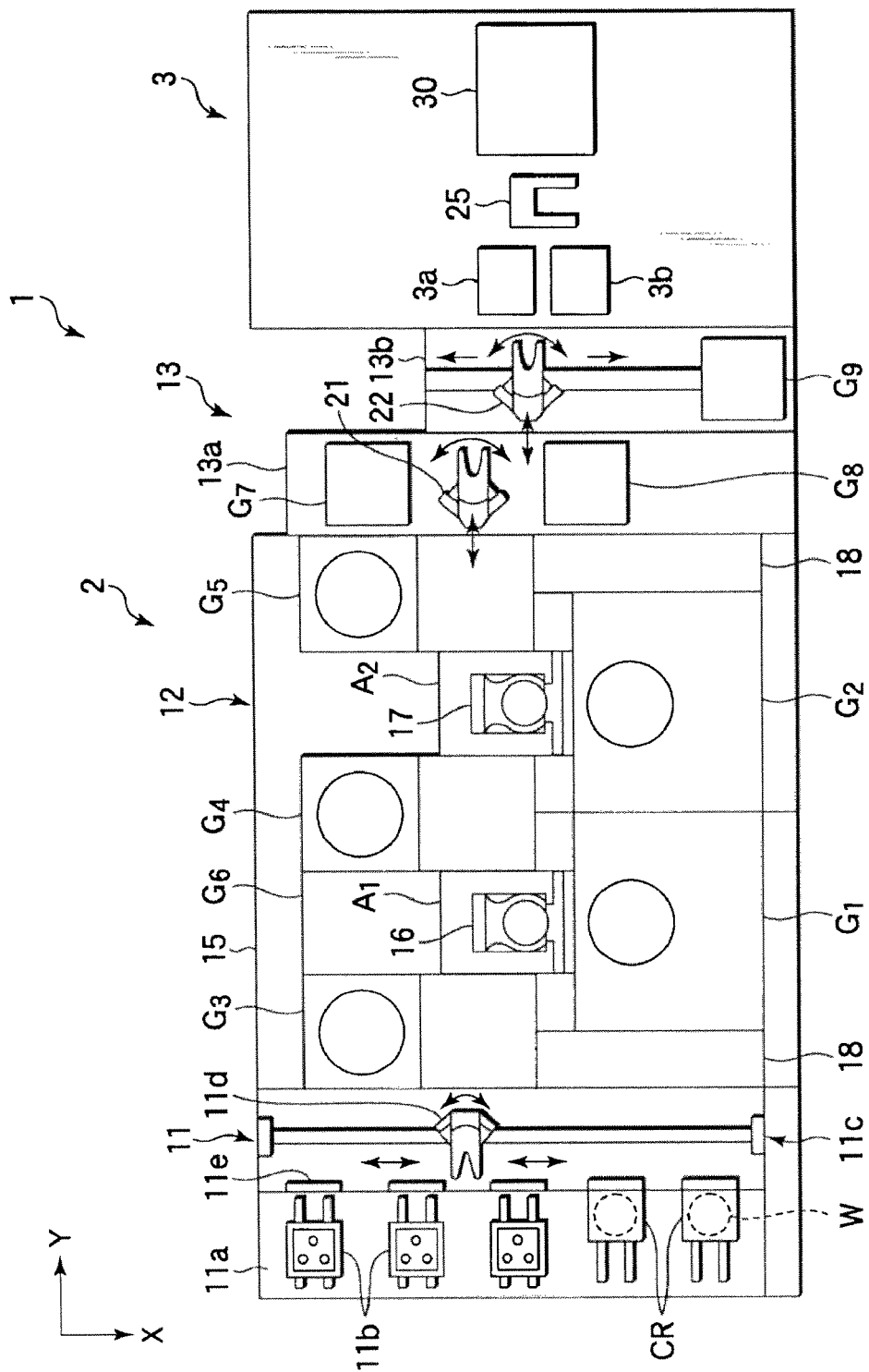
FIG. 1 is a plan view schematically showing a pattern forming system including a coating/developing apparatus according to an embodiment of the present invention.
Figure 2:
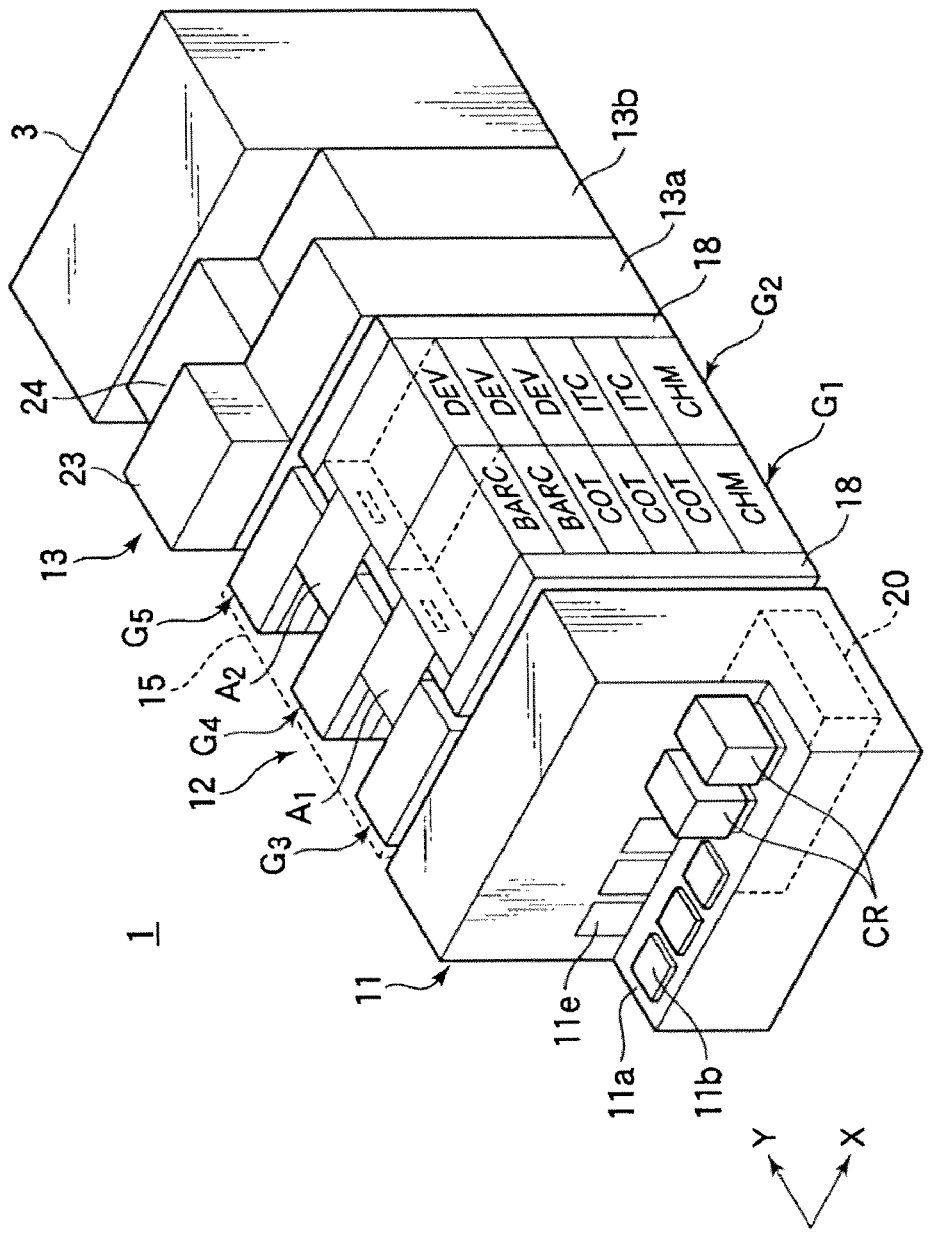
FIG. 2 is a perspective view schematically showing the pattern forming system shown in FIG. 1.

FIG. 1 is a plan view schematically showing a pattern forming system including a coating/developing apparatus according to an embodiment of the present invention. FIG. 2 is a perspective view schematically showing the pattern forming system.

The pattern forming system 1 is designed to form a predetermined resist pattern on a semiconductor substrate or wafer W. The system includes a coating/developing apparatus 2 for performing resist coating or the like on the wafer W and development after light exposure, and an immersion light exposure apparatus 3 for performing a light exposure process on the wafer W. The coating/developing apparatus 2 includes a cassette station 11 used as a transfer station for wafers W, a process station 12 comprising a plurality of processing units each for performing a predetermined process on a wafer W, and an interface station 13 for transferring wafers W between the process station 12 and light exposure apparatus 3. The cassette station 11, process station 12, interface station 13, and light exposure apparatus 3 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12, as described later. The cassette table 11a and wafer transfer mechanism 11c are arrayed in series in this order in the Y-direction. The cassette table 11a has a plurality of, such as five, positioning portions 11b each for positioning a wafer cassette (CR), arrayed thereon in the width direction of the pattern forming system 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transit unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$. Furthermore, the process station 12 includes a sixth processing unit group $G_6$ behind the first main transfer section $A_1$.

As shown in FIG. 2, the first processing unit group $G_1$ includes a plurality of, such as ten, processing units stacked one on the other, which are formed of two bottom coating units (BARC) for forming an anti-reflective coating that prevents reflection of light during light exposure on a wafer W, and three resist coating units (COT) for forming a resist film on a wafer W. The second processing unit group $G_2$ includes a plurality of processing units stacked one on the other, which are formed of, e.g., three development units (DEV) for performing a developing process on a wafer W, and two top coating units (ITC) for forming a protection film (top coating film) having water repellency on a resist film formed on a wafer W.

Figure 3:
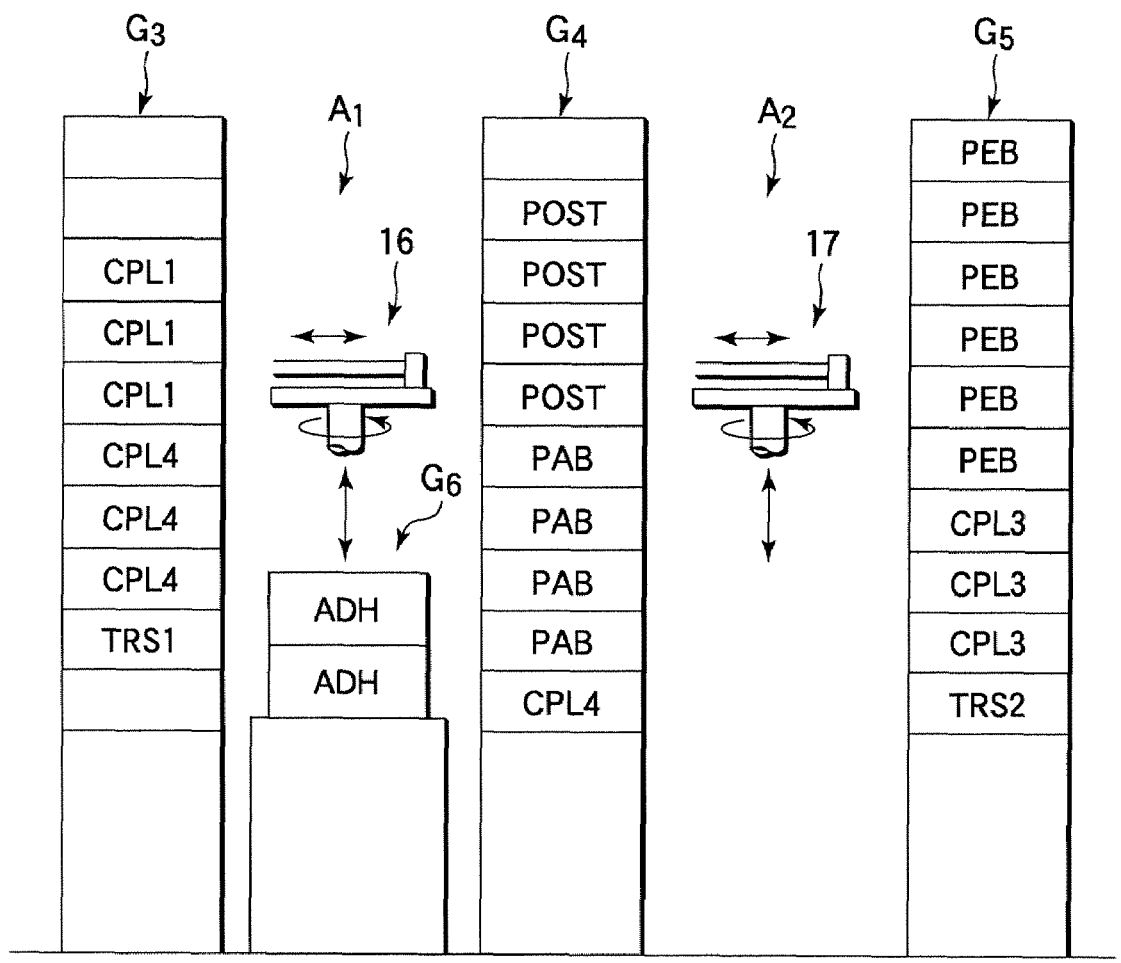
FIG. 3 is a schematic view for explaining mainly the structure of a third processing unit group $G_3$, a fourth processing unit group $G_4$, and a fifth processing unit group $G_5$ disposed in the coating/developing apparatus of the pattern forming system shown in FIG. 1.

The third processing unit group $G_3$, fourth processing unit group $G_4$, and fifth processing unit group $G_5$ includes a plurality of, such as ten, processing units stacked one on the other in each group. These processing units comprises, e.g., a pre-baking unit (PAB) for performing a heating process on a wafer W after resist coating, a post-baking unit (POST) for performing a heating process on a wafer W after development, a post-exposure baking unit (PEB) for performing a heating process on a wafer W after light exposure and before development, a temperature adjusting unit or cooling unit (CPL1) for adjusting, to a predetermined temperature, a wafer W treated by a hydrophobic process or pre-baking, a temperature adjusting unit or cooling unit (CPL3) for adjusting, to a predetermined temperature, a wafer W heated by the post-exposure baking unit (PEB), a cooling unit (CPL4) for cooling a wafer W heated by the post-baking unit (POST), and so forth. The sixth processing unit group $G_6$ includes, e.g., two processing units stacked one on the other, which are formed of adhesion units for performing a hydrophobic process on a wafer W. These processing units are arranged as shown in FIG. 3, for example. Further, as shown in FIG. 3, the third processing unit group $G_3$ includes a transit unit (TRS1) used as a relay position for wafers W between the cassette station 11 and first main transfer section $A_1$. The fifth processing unit group $G_5$ includes a transit unit (TRS2) used as a relay position for wafers W between the second main transfer section $A_2$ and a first interface station transfer mechanism 21 disposed in the interface station 13, as described later.

Each of the pre-baking units (PAB) and post-baking units (POST) includes a heating plate, which is accessible by both of the first main transfer section Al and second main transfer section $A_2$.

Each of the post-exposure baking units (PEB) includes a heating plate for heating a wafer W and a cooling plate for cooling a heated wafer, which are accessible by both of the first main transfer section $A_1$ and second main transfer section $A_2$. The structure of the post-exposure baking unit (PEB) will be explained later in detail, because it is important for the present invention.

The first main transfer section $A_1$ is provided with a first main wafer transfer arm 16 for handling wafers W, which can selectively access the units located in the first processing unit group $G_1$, third processing unit group $G_3$, fourth processing unit group $G_4$, and sixth processing unit group $G_6$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13 (see FIG. 1). Each of the temperature/humidity adjusting units 18 includes a temperature adjusting device for process liquids to be supplied to the first and second processing unit groups $G_1$ and $G_2$, and a duct for adjustment of temperature and humidity. Chemical units (CHM) are respectively disposed below the first and second processing unit groups $G_1$ and $G_2$, for supplying chemical solutions to the first and second processing unit groups $G_1$ and $G_2$ (see FIG. 2).

The interface station 13 includes a first interface station 13a on the process station 12 side and a second interface station 13b on the light exposure apparatus 3 side. The first interface station 13a is provided with a first interface station transfer mechanism 21 for transferring wafers W, disposed to face an opening portion of the fifth processing unit group $G_5$. The second interface station 13b is provided with a second interface station transfer mechanism 22 for transferring wafers W, movable in the X-direction.

Figure 4:
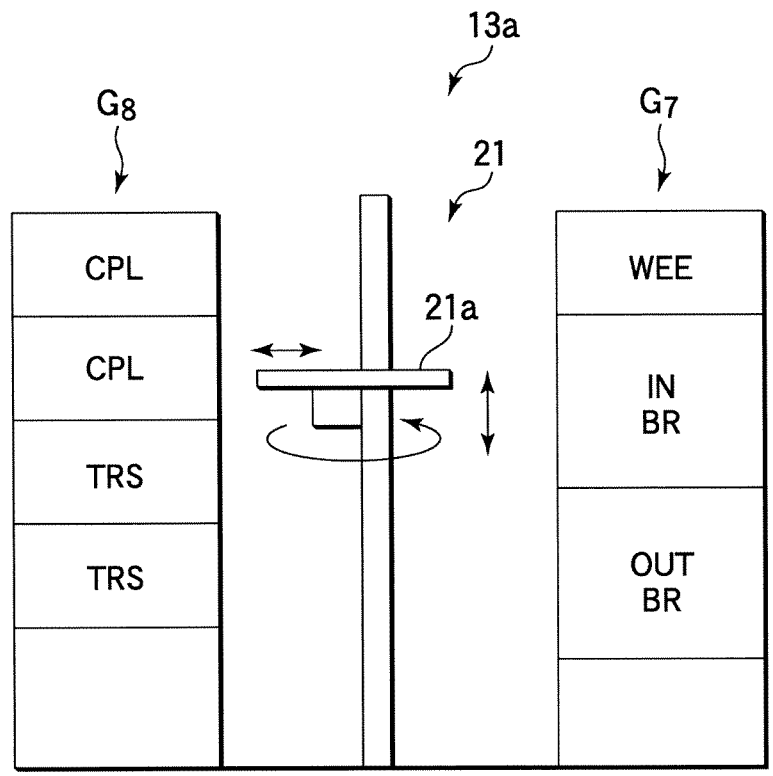
FIG. 4 is a side view showing a first interface station disposed in the coating/developing apparatus of the pattern forming system shown in FIG. 1.

As also shown in FIG. 4, a seventh processing unit group $G_7$ is located on the rear side of the first interface station 13a, and includes a periphery light exposure unit (WEE), an incoming buffer cassette (INBR), and an outgoing buffer cassette (OUTBR), stacked one on the other. The periphery light exposure unit (WEE) is used for performing light exposure selectively only on the edge portion of a wafer W to remove unnecessary resist portion near the edge of the wafer. The incoming buffer cassette (INBR) is used for temporarily placing wafers W to be transferred to the light exposure apparatus 3. The outgoing buffer cassette (OUTBR) is used for temporarily placing wafers W transferred from the light exposure apparatus 3. An eighth processing unit group $G_8$ is located on the front side of the first interface station 13a, and includes four units stacked one on the other, which are formed of two high-precision temperature adjusting units (CPL) and two transit units (TRS). Each of the temperature adjusting units (CPL) is used for adjusting the temperature of a wafer W with high precision before it is transferred to the light exposure apparatus 3. Each of the transit units (TRS) is used for placing wafers after light exposure.

Figure 5:
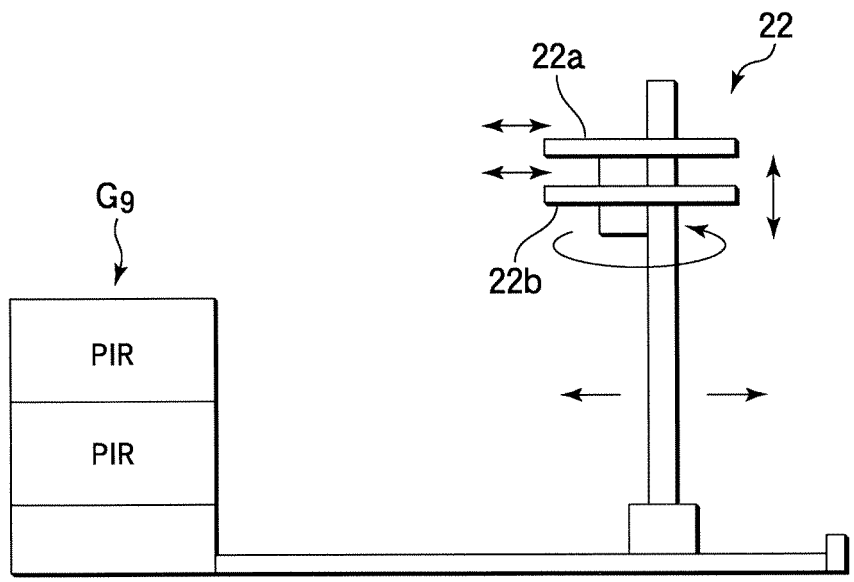
FIG. 5 is a side view showing a second interface station disposed in the coating/developing apparatus of the pattern forming system shown in FIG. 1.

Further, as shown in FIG. 5A, a ninth processing unit group $G_9$ is located on the front side of the second interface station 13, and includes two cleaning units (PIR) stacked one on the other for cleaning and drying a wafer W after immersion light exposure. Each of the cleaning units (PIR) includes a spin chuck for holding and rotating a wafer W in a horizontal state. While the wafer W is rotated, a cleaning liquid is first supplied onto the center of the surface of the wafer W to perform a cleaning process, and then the liquid is thrown off from the wafer W to perform a drying process.

The first interface station transfer mechanism 21 includes a fork 21a for transferring wafers W. The fork 21a is movable up and down and rotatable so that it can selectively access the units located in the fifth processing unit group $G_5$, sixth processing unit group $G_6$, and seventh processing unit group $G_7$ to transfer wafers W between these units.

The second interface station transfer mechanism 22 includes two forks 22a and 22b on the upper and lower sides for transferring wafers W. Each of the forks 22a and 22b is horizontally movable in the Y-direction shown in FIG. 1, movable up and down, and rotatable, so that it can selectively access the units located in the seventh processing unit group $G_7$, and an incoming stage 3a and an outgoing stage 3b of the light exposure apparatus 3 described later to transfer wafers W between these portions. The upper fork 22a is used for loading to the light exposure apparatus 3, while the lower fork 22b is used for unloading from the light exposure apparatus 3. Where the fork 22b for handling a wet wafer W is disposed on the lower side, as in this embodiment, a dry wafer W held by the fork 22a is prevented from suffering droplets from above.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus 3 (see FIG. 2).

The light exposure apparatus 3 includes an incoming stage 3a for placing thereon wafers W transferred from the interface station 13, and an outgoing stage 3b for placing thereon wafers W to be transferred to the interface station 13. The light exposure apparatus 3 further includes an immersion light exposure section 30 structured to perform light exposure on a resist film formed on a wafer W while immersing the resist film in a predetermined liquid. A wafer transfer mechanism 25 is disposed to transfer wafers W between the incoming stage 3a, immersion light exposure section 30, and outgoing stage 3b.

As shown in FIG. 2, a control section 20 is located below the cassette station 11 and is used for controlling the coating/developing apparatus 2, as a whole. The control section 20 will be explained in detail later. The light exposure apparatus 3 also includes a control section (not shown).

Where product wafers are processed in the pattern forming system 1 including the coating/developing apparatus 2 and light exposure apparatus 3 structured as described above, wafers W are taken out one by one from a wafer cassette (CR) by the transfer pick lid of the wafer transfer mechanism 11c. A wafer W thus taken out is transferred by the transfer pick 11d into the transit unit (TRS1) of the third processing unit group $G_3$ of the process station 12. Then, the wafer W is sequentially transferred by the first and second main transfer sections $A_1$ and $A_2$ through predetermined units in the first to sixth processing unit groups $G_1$ to $G_6$, so that the wafer W is subjected to a series of processes in accordance with the order prescribed in a recipe. For example, the wafer W is subjected to an adhesion process in one of the adhesion units (ADH), formation of an anti-reflective coating in one of the bottom coating units (BARC), formation of a resist film in one of the resist coating units (COT), formation of a protection film in one of the top coating units (ITC), and a pre-baking process in one of the pre-baking units (PAB) in this order. In this case, the adhesion process is performed, as needed.

Thereafter, the wafer W is transferred by the second main transfer section $A_2$ into the transit unit (TRS2) of the fifth processing unit group $G_5$. Then, the wafer W is transferred by the first interface station transfer mechanism 21 of the first interface station 13a into the periphery light exposure unit (WEE), in which the wafer W is subjected to a periphery light exposure process. Further, the wafer W is transferred into one of the high-precision temperature adjusting units (CPL), in which the wafer W is subjected to temperature adjustment. Then, the wafer W is transferred by the second interface station transfer mechanism 22 (fork 22a) of the second interface station 13b from the high-precision temperature adjusting unit (CPL) onto the incoming stage 3a of the light exposure apparatus 3. Then, the wafer W is transferred by the wafer transfer mechanism 25 of the light exposure apparatus 3 into the immersion light exposure section 30, in which the wafer W is subjected to an immersion light exposure process. Thereafter, the wafer W is transferred by the wafer transfer mechanism 25 onto the outgoing stage 3b. Thereafter, the wafer W is transferred by the second interface station transfer mechanism 22 (fork 22b) of the second interface station 13b into one of the cleaning units (PIR), in which the wafer W is subjected to cleaning/drying. Then, the wafer W is transferred by the second interface station transfer mechanism 22 (fork 22b) into one of the transit units (TRS) of the first interface station 13a. Then, the wafer W is transferred by the first interface station transfer mechanism 21 of the first interface station 13a from this transit unit (TRS) into one of the post-exposure baking units (PEB) of the fifth processing unit group $G_5$.

After the wafer W is subjected to a post-exposure baking process in this post-exposure baking unit (PEB), the wafer W is sequentially transferred by the first and second main transfer sections $A_1$ and $A_2$ through predetermined units, so that the wafer W is subjected to a series of processes in accordance with the order prescribed in the recipe. For example, after the post-exposure baking process, the wafer W is sequentially subjected to a developing process in one of the development units (DEV), a post-baking process in one of the post-baking units (POST), and a cooling process in one of the cooling units (CPL4). Thereafter, the wafer W is transferred into the transit unit (TRS1) of the third processing unit group $G_3$, and is further transferred to a wafer cassette (CR) placed on the cassette station 11.

During the steps described above, the reaction of a resist of the chemical amplification type proceeds in the time period from the end of light exposure to the start of a heating process. Accordingly, if the post-exposure delay time (PED time), which is defined by the time period from the end of the light exposure performed by the light exposure apparatus 3 to the start of the heating process performed by one of the post-exposure baking processing units (PEB), is fluctuated, the uniformity of line width becomes poor. However, in the interface station 13, the first and second interface station transfer mechanisms 21 and 22 are controlled independently of each other in an asynchronous manner, and the PED time is thereby inevitably fluctuated among substrates depending on the situation of the transfer. In order to ensure the line width uniformity, it is effective to set each wafer W on standby before heating inside the post-exposure baking unit (PEB), so as to make the PED time constant, as in the technique disclosed in Jpn. Pat. Appln. KOKAI Publication No. 2004-193597. However, in the case of an immersion light exposure process, since a cleaning process performed in a cleaning unit (PIR) increases the waiting time in the post-exposure baking unit (PEB), the number of post-exposure baking units (PEB) needs to be larger to maintain the same throughput.

This embodiment is conceived to provide a technique for making the PED time constant without increasing the number of post-exposure baking units (PEB), as explained below.

At first, an explanation will be given of the post-exposure baking unit (PEB).

Figure 6A:
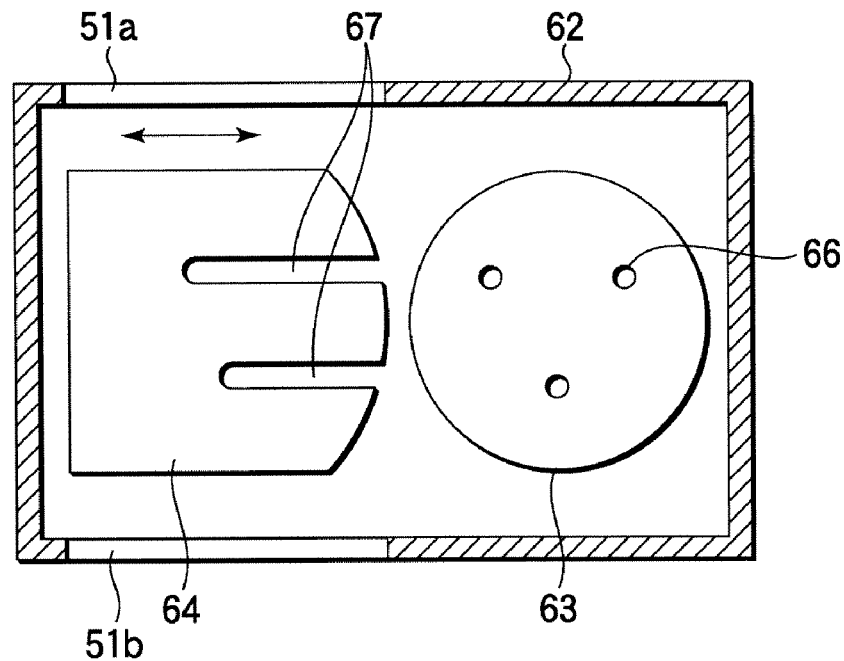
FIG. 6A is a sectional plan view showing a post-exposure baking unit disposed in the coating/developing apparatus of the pattern forming system shown in FIG. 1.
Figure 6B:
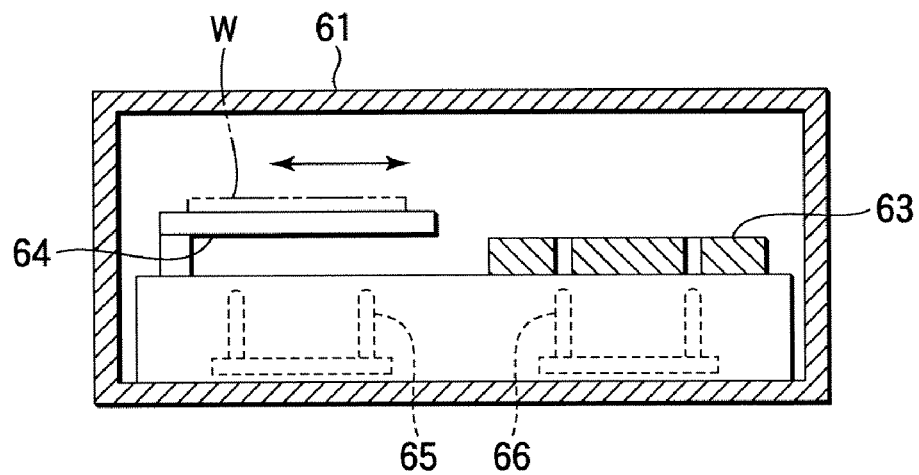
FIG. 6B is a sectional side view showing the post-exposure baking unit disposed in the coating/developing apparatus of the pattern forming system shown in FIG. 1.

As shown in FIGS. 6A and 6B, the post-exposure baking unit (PEB) includes a casing 62 in which a heating plate 63 and a cooling plate 64 serving as a transfer arm as well are disposed side by side. The casing 62 has transfer ports 51a and 51b formed in sidewalls at opposite positions corresponding to the cooling plate 64, through which the first main transfer section $A_1$ and second main transfer section $A_2$ can respectively access the inside. When a wafer W is loaded, it is first placed on the cooling plate 64. The cooling plate 64 is movable by a driving mechanism (not shown) between a reference position shown in FIGS. 6A and 6B and a position directly above the heating plate 63. Lifter pins 65 and 66 for transferring the wafer W are disposed at positions corresponding to the reference position of the cooling plate 64 and at positions corresponding to the heating plate 63. The cooling plate 64 has slits 67 to avoid interference with the lifter pins 65 and 66. The wafer W is transferred to and from the heating plate 63 by the cooling plate 64. Further, the wafer W can be set on standby while the wafer W is placed on the cooling plate 64 located at the reference position. The wafer W can be also set on standby while the wafer W is placed on the lifter pins 65 or 66 in the projected state. Each of the transfer ports 51a and 51b is opened and closed by a shutter (not shown).

Figure 7:
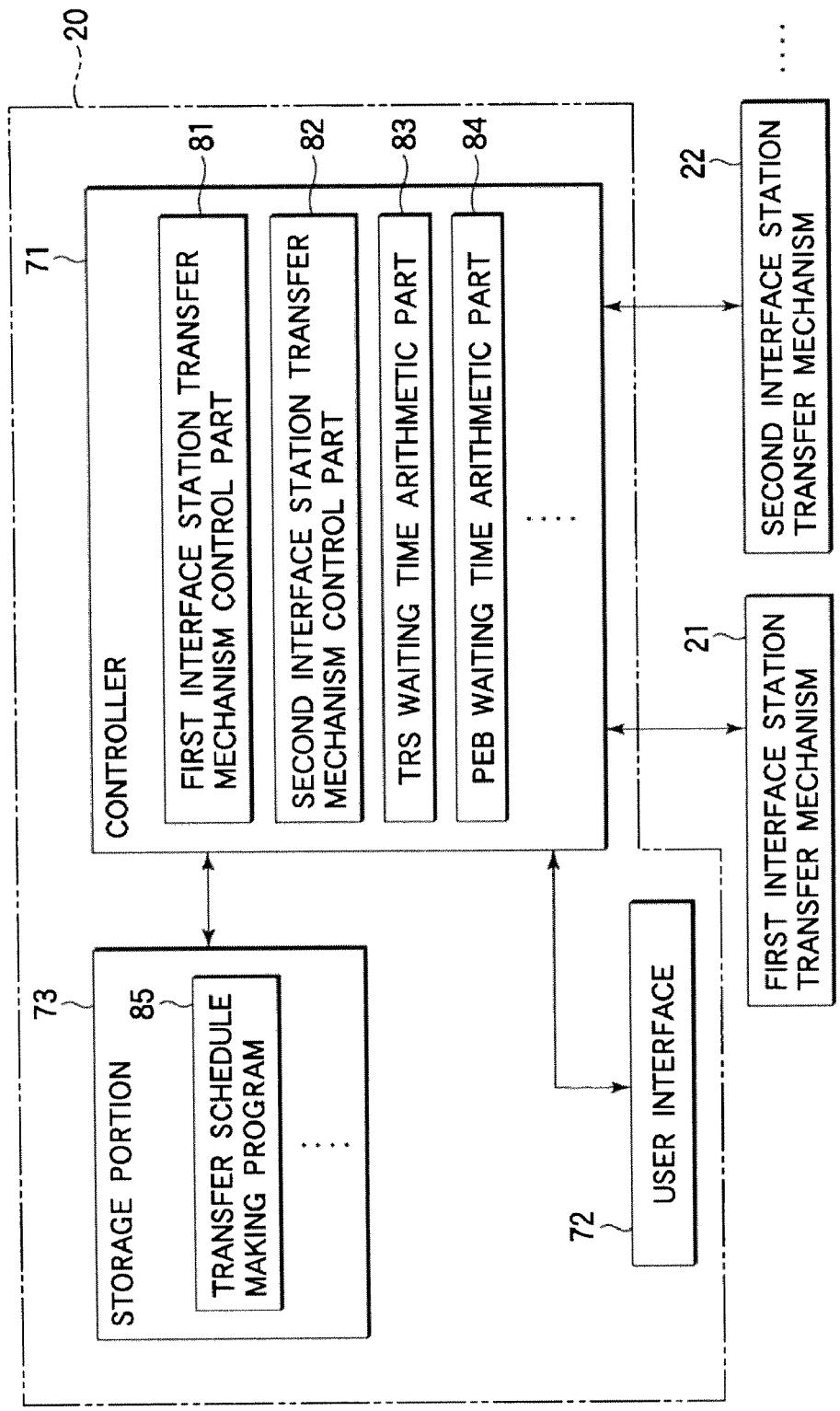
FIG. 7 is a block diagram showing a main part of a control section used in the coating/developing apparatus of the pattern forming system shown in FIG. 1.

Next, an explanation will be given of a control section 20. FIG. 7 is a block diagram showing a main part of the control section 20.

The control section 20 is designed to control the coating/developing apparatus 2 as a whole. The control section 20 includes a controller 71 comprising a microprocessor (MPU) for controlling the respective components included in the coating/developing apparatus 2, such as the processing units and transfer mechanisms. The control section 20 further includes a user interface 72 and a storage portion 73 that stores data necessary for processes.

The user interface 72 and storage portion 73 are connected to the controller 71. The user interface 72 comprises, e.g., a keyboard and a display, wherein the keyboard is used for an operator to input commands for operating the respective components in the coating/developing apparatus 2, and the display is used for showing visualized images of the operational status of the respective components in the coating/developing apparatus 2. The storage portion 73 stores control programs for realizing various processes performed in the coating/developing apparatus 2 under the control of the controller 71, and control programs or recipes for the respective components in the coating/developing apparatus 2 to perform predetermined processes in accordance with process conditions. Recipes are stored in the storage medium or media of storage portion 73. For example, the storage medium or media are formed of a stationary type, such as a hard disc, and/or a portable type, such as a CDROM, DVD, or flash memory.

Although the control section 20 is designed to control the coating/developing apparatus 2 as a whole, the following explanation will be made, focusing on the control of the transfer system in the interface station 13, in relation to the core point of the embodiment.

The controller 71 includes a first interface station transfer mechanism control part 81 for controlling the first interface station transfer mechanism 21 of the interface station 13, and a second interface station transfer mechanism control part 82 for controlling the second interface station transfer mechanism 22 of the interface station 13. The controller 71 further includes a TRS waiting time arithmetic part 83 for calculating a waiting time to set a wafer W on standby at each transit unit (TRS) of the eighth processing unit group $G_8$, and a PEB waiting time arithmetic part 84 for calculating a waiting time to set a wafer W on standby at each post-exposure baking unit (PEB).

The TRS waiting time arithmetic part 83 calculates a waiting time of a wafer W in each transit unit (TRS) such that a post-exposure delay time (second PED time) always takes on the maximum value. The second PED time is defined by a time period associated with the second interface station transfer mechanism 22 from a time when the second interface station transfer mechanism 22 receives a wafer W from the light exposure apparatus 3 and transfers it into one of the transit units (TRS) of the eighth processing unit group $G_8$ to a time when the first interface station transfer mechanism 21 receives the wafer W from this transit unit (TRS).

The PEB waiting time arithmetic part 84 calculates a waiting time of a wafer W in each post-exposure baking unit (PEB) such that a post-exposure delay time (first PED time) always takes on the maximum value. The first PED time is defined by a time period associated with the first interface station transfer mechanism 21 from a time when the first interface station transfer mechanism 21 receives a wafer W from each transit unit (TRS) and transfers it into one of the post-exposure baking units (PEB) to a time when a post-exposure baking process starts in this post-exposure baking unit (PEB).

The storage portion 73 stores a plurality of transfer recipes for wafers W and a transfer schedule making program 85 for making transfer schedules of wafers W in accordance with the transfer recipes. The transfer schedules are formed to show correlations between wafers W and modules (for example, the processing units and transit units) that are treating the respective wafers W.

Figure 8:
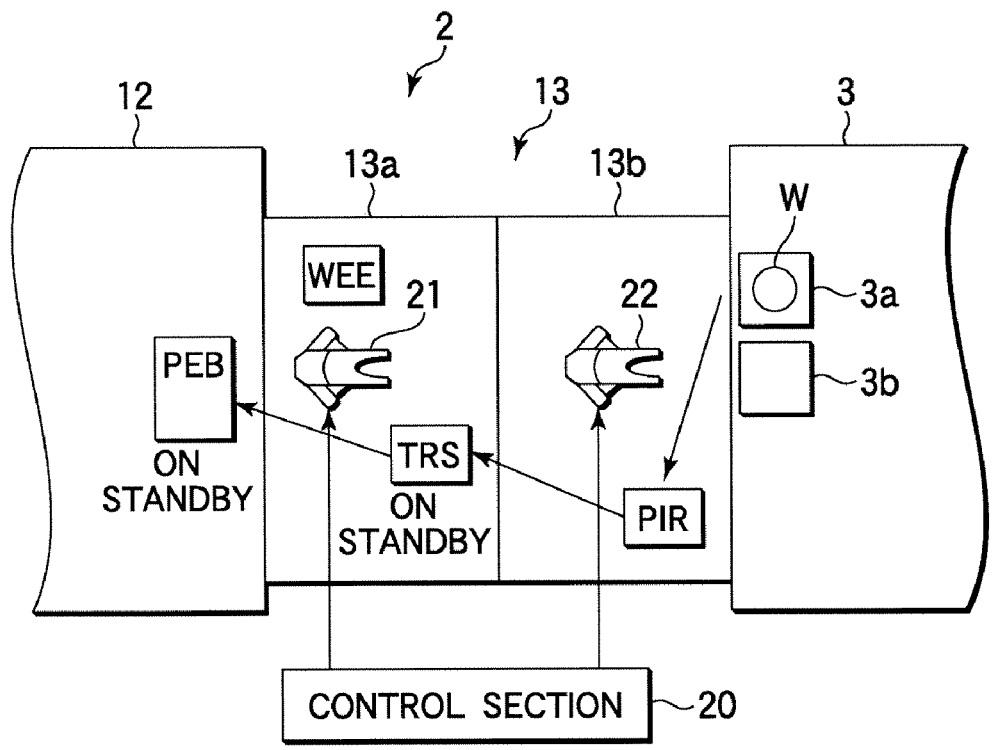
FIG. 8 is a schematic view for explaining control of transfer mechanisms in the first and second interface stations in the time period from the end of light exposure to the start of a post-exposure baking process performed by the post-exposure baking unit.

Next, an explanation will be given of control of the PED time performed by the control section 20 according to this embodiment. As described above, in order to prevent the PED time from the end of light exposure to the start of the post-exposure baking process from being fluctuated among wafers W, a waiting time of the wafers is used to make the PED time constant among the wafers. However, only with a waiting operation in the post-exposure baking unit (PEB), the PED time is prolonged, and the number of post-exposure baking units (PEB) needs to be larger. In light of this, according to this embodiment, the second interface station transfer mechanism 22 and first interface station transfer mechanism 21 are examined in terms of the respective maximum delay times, and are provided with respective waiting times, so that the waiting time in the post-exposure baking unit (PEB) is shortened. Specifically, as shown in FIG. 8, each transit unit (TRS) of the eighth processing unit $G_8$ is used as a wafer waiting position associated with the second interface station transfer mechanism 22. Further, each post-exposure baking unit (PEB) is used as a wafer waiting position associated with the first interface station transfer mechanism 21. On this premise, the time period from the end of light exposure performed by the light exposure apparatus 3 to the start of a post-exposure baking process performed by the post-exposure baking unit (PEB) is made constant among wafers by the control section 20.

Figure 9:
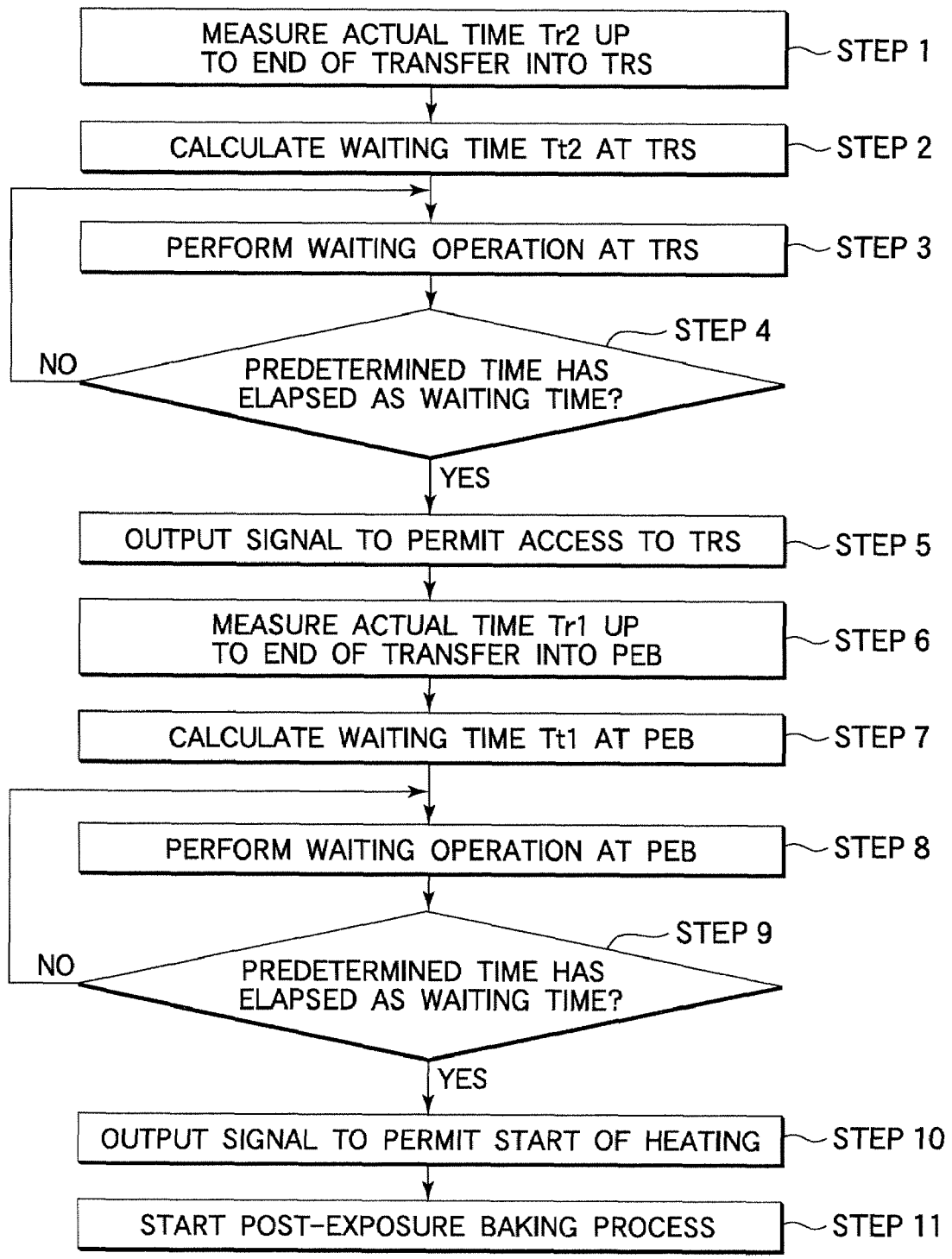
FIG. 9 is a flow chart showing a flow in controlling a PED time by the control section.

FIG. 9 is a flow chart showing a flow in controlling the PED time by the control section 20.

At first, a time Tr2 subsequent to the light exposure is measured (STEP 1), wherein the time Tr2 is defined by a time period actually used from a time when an out-ready signal is output after a wafer W is placed on the outgoing stage 3b of the light exposure apparatus 3 to a time when the wafer W is transferred into one of the transit units (TPS) by the second interface station transfer mechanism 22. Then, a waiting time Tt2 at the transit unit (TRS) is calculated on the basis of Tr2 measured in STEP 1 (STEP 2). At this time, the waiting time Tt2 is calculated by subtracting Tr2 described above from the maximum value Tp2max of the post-exposure delay time (second PED time) Tp2 obtained in advance in relation to the second interface station transfer mechanism 22. This is expressed as follows:

$$Tt2 = Tp2\max - Tr2$$

The maximum value Tp2max of the second PED time Tp2 is produced where the second interface station transfer mechanism 22 is caused to perform the following operations when the out-ready signal is output after a wafer W is placed on the outgoing stage of the light exposure apparatus 3. Specifically, the second interface station transfer mechanism 22 first transfers a wafer W from one of the cleaning units (PIR) into one of the transit units (TRS) of the eighth processing unit group $G_8$, and then transfers a wafer W from one of the high-precision temperature adjusting units (CPL) of the eighth processing unit group $G_8$ onto the incoming stage 3a of the light exposure apparatus. Thereafter, the second interface station transfer mechanism 22 accesses the outgoing stage 3b and transfers the wafer W from the outgoing stage 3b into one of the cleaning units (PIR). Even after this cleaning is finished, the second interface station transfer mechanism 22 transfers another wafer W from the outgoing stage 3b into another one of the cleaning units (PIR), and then transfers a wafer W from one of the high-precision temperature adjusting units (CPL) onto the incoming stage 3a. Thereafter, the second interface station transfer mechanism 22 transfers the wafer W from said one of the cleaning units (PIR) to one of the transit units (TRS). A condition of Tr2=Tp2max brings about the waiting time Tt2=0.

On the other hand, the minimum value Tp2min of the second PED time Tp2 is produced where the second interface station transfer mechanism 22 is permitted to immediately access the outgoing stage 3b when the out-ready signal is output after a wafer W is placed on the outgoing stage of the light exposure apparatus 3, and is further permitted to immediately access the cleaning unit (PIR) when the cleaning is finished in this cleaning unit (PIR). At this time, the waiting time Tt2 takes on the maximum value Tt2max. Accordingly, for the normal process, a condition of $0 \leq Tt2 \leq Tt2\max$ is satisfied.

Thereafter, on the basis of the calculation result described above, a waiting operation is performed (STEP 3), while a judgment is made of whether or not a predetermined time has elapsed as the waiting time (STEP 4). Where the predetermined time has elapsed, a signal is output to permit the first interface station transfer mechanism 21 to access the transit unit (TRS) (STEP 5). Then, a time Tr1 is measured (STEP 6), wherein the time Tr1 is defined by a time period actually used from a time when the access permission signal is output to a time when the wafer W is transferred into one of the post-exposure baking units (PEB) by the first interface station transfer mechanism 21. Then, a waiting time Tt1 at the post-exposure baking unit (PEB) is calculated on the basis of Tr1 measured in STEP 6 (STEP 7). At this time, the waiting time Tt1 is calculated by subtracting Tr1 described above from the maximum value Tp1max of the post-exposure delay time (first PED time) Tp1 obtained in advance in relation to the first interface station transfer mechanism 21. This is expressed as follows:

$$Tt1 = Tp1\max - Tr1$$

The maximum value Tp1max of the first PED time Tp1 is produced where the first interface station transfer mechanism 21 is caused to perform the following operations when the access permission signal is output in STEP 5. Specifically, the first interface station transfer mechanism 21 first moves to the transit unit (TRS2) of the fifth processing unit group $G_5$ to receive a wafer W, and transfers the wafer W into the periphery light exposure unit (WEE) of the seventh processing unit group $G_7$, and further transfers a wafer W present therein into the incoming buffer cassette (INBR). Thereafter, the first interface station transfer mechanism 21 transfers the wafer W from the transit unit (TRS) of the eighth processing unit group $G_8$ into one of the post-exposure baking units (PEB). A condition of Tr1 32 Tp1max brings about the waiting time Tt1=0.

On the other hand, the minimum value Tp1min of the first PED time Tp1 is produced where the first interface station transfer mechanism 21 is permitted to immediately access the transit unit (TRS) when the access permission signal is output in STEP 5.

Thereafter, on the basis of the calculation result described above, a waiting operation is performed (STEP 8), while a judgment is made of whether or not a predetermined time has elapsed as the waiting time (STEP 9). Where the predetermined time has elapsed, a signal is output to permit a heating process (STEP 10), so that a post-exposure baking process is started on the wafer placed on the heating plate 63 in the post-exposure baking unit (PEB) (STEP 11).

As described above, a wafer is set on standby at the post-exposure baking unit (PEB) by use of not the entirety of the time period defined by subtracting an actual transfer time from the maximum value of the PED time. Specifically, parts of the PED time are respectively associated with the first and second interface station transfer mechanisms 21 and 22, and a waiting time corresponding to the part of the PED time associated with the second interface station transfer mechanism 22 is applied to the transit unit (TRS) other than the post-exposure baking unit (PEB), so that the waiting time in the post-exposure baking unit (PEB) is shortened. Accordingly, it is possible to avoid an increase in the number of post-exposure baking units (PEB).

Next, an explanation will be given of a specific example. FIGS. 10A and 10B are time charts showing specific examples of a PED time management, wherein FIG. 10A shows a case where the PED time is shortest, and FIG. 10B shows a case where the PED time is longest.

In the case shown in FIG. 10A where the PED time is shortest, a time period of 7.0 sec. (FIG. 10A, (1)) elapses from a time when the out-ready signal is output after a wafer W is placed on the outgoing stage 3b of the light exposure apparatus 3 to a time when the second interface station transfer mechanism 22 transfers the wafer W from the outgoing stage 3b into one of the cleaning units (PIR). Then, a time period of 27.0 sec. (FIG. 10A, (2)) elapses while a process is performed in the cleaning unit (PIR). Then a time period of 7.0 sec. (FIG. 10A, (3)) elapses after the cleaning while the second interface station transfer mechanism 22 transfers the wafer W from the cleaning unit (PIR) to one of the transit units (TRS). Accordingly, the minimum value Tp2min of the second PED time Tp2 is expressed by Tp2min=(1)+(2)+(3)=41.0 sec. Further, a time period of 6.0 sec. (FIG. 10A, (4)) elapses from a time when the access permission signal is output in STEP 5 to a time when the first interface station transfer mechanism 21 transfers the wafer W from the transit unit (TRS) into one of the post-exposure baking units (PEB). Accordingly, the minimum value Tp1min of the first PED time Tp1 is expressed by Tp1min=(4)=6.0 sec.

In the case shown in FIG. 10B where the PED time is longest, when the out-ready signal is output after a wafer W is placed on the outgoing stage 3b of the light exposure apparatus 3, the second interface station transfer mechanism 22 is not permitted to immediately receive the wafer W. Specifically, a time period of 7.0 sec. (FIG. 10B, (i)) elapses while the second interface station transfer mechanism 22 transfers a wafer W from one of the cleaning units (PIR) into one of the transit units (TRS) of the eighth processing unit group $G_8$. Then, a time period of 7.0 sec. (FIG. 10B, (ii)) elapses while the second interface station transfer mechanism 22 transfers a wafer W from one of the high-precision temperature adjusting units (CPL) of the eighth processing unit group $G_8$ onto the incoming stage 3a of the light exposure apparatus. After a time period of (i)+(ii)=14.0 sec. has elapsed, the second interface station transfer mechanism 22 performs the transfer of (1). Further, when the cleaning process of (2) is finished, the second interface station transfer mechanism 22 is not permitted to immediately receive the wafer W. Specifically, a time period of 7.0 sec. (FIG. 10B, (iii)) elapses while the second interface station transfer mechanism 22 transfers another wafer W from the outgoing stage 3b into another one of the cleaning units (PIR). Then, a time period of 7.0 sec. (FIG. 10B, (iv)) elapses while the second interface station transfer mechanism 22 transfers a wafer W from one of the high-precision temperature adjusting units (CPL) onto the incoming stage 3a. After a time period of (iii)+(iv)=14.0 sec. has elapsed, the second interface station transfer mechanism 22 performs the transfer of (3). Accordingly, the maximum value Tp2max of the second PED time Tp2 is expressed by Tp2max=(1)+(2)+(3)+(i)+(ii)+(iii)+(iv)=69 sec.

Further, when the access permission signal is output in STEP 5, the first interface station transfer mechanism 21 is not permitted to immediately move to the transit unit (TRS) of the eighth processing unit group $G_8$ to receive the wafer W. Specifically, a time period of 11.8 sec. (FIG. 10B, (v)) elapses while the first interface station transfer mechanism 21 moves to the transit unit (TRS2) of the fifth processing unit group $G_5$ to receive a wafer W, and transfers the wafer W into the periphery light exposure unit (WEE) of the seventh processing unit group $G_7$, and further transfers a wafer W present therein into the incoming buffer cassette (INBR). After this time period has elapsed, the first interface station transfer mechanism 21 performs the transfer of (4). Accordingly, the maximum value Tp1max of the first PED time Tp1 shown in FIG. 10B is expressed by Tp1max=(4)+(v)=17.8 sec.

As described above, in the case shown in FIG. 10A where the PED time is shortest, the part thereof associated with the second interface station transfer mechanism 22 is shorter than the longest case by 69.0−41.0=28.0 sec. Further, the part thereof associated with the first interface station transfer mechanism 21 is shorter than the longest case by 17.8−6.0=11.8 or about 12.0 sec. Consequently, a fluctuation with a maximum value of 28.0 sec. associated with the second interface station transfer mechanism 22 is adjusted by use of a waiting operation at each transit unit (TRS) of the eighth processing unit group $G_8$. Further, a fluctuation with a maximum value of 12.0 sec. associated with the first interface station transfer mechanism 21 is adjusted by use of a waiting operation at each post-exposure baking unit (PEB).

In this case, if all the fluctuations of the PED time are adjusted by use of a waiting operation at the post-exposure baking unit (PEB), as in the technique disclosed in Jpn. Pat. Appln. KOKAI Publication No. 2004-193597 described above, the waiting time needs to be 28.0+12.0=40.0 sec., which is very long. On the other hand, according to the example described above, the waiting time at the post-exposure baking unit (PEB) is only 12.0 sec. The necessary number of post-exposure baking units (PEB) is determined by the process time, waiting time, and transfer time in relation to the PEB, as well as an aiming cycle time, wherein the number becomes larger with an increase in the sum of the process time and waiting time. In the example described above, where an aiming cycle time is 24 sec., the necessary number of post-exposure baking units (PEB) is seven. If all the waiting times are adsorbed at the post-exposure baking unit (PEB) under the same conditions, the necessary number thereof is eight. Specifically, it has been confirmed that the method according to this embodiment can decrease the necessary number of post-exposure baking units (PEB), as compared with the method disclosed in Jpn. Pat. Appln. KOKAI Publication No. 2004-193597.

As described above, according to the present invention a substrate is set on standby at two positions, i.e., the relay position described above and the waiting position of the post-exposure baking unit, so that the time period from the end of light exposure performed by the light exposure apparatus to the start of a post-exposure baking process performed by the post-exposure baking unit (PEB) is made constant among substrates. Consequently, it is possible to shorten the waiting time at the post-exposure baking unit and to make the post-exposure delay time constant among wafers without increasing the number of post-exposure baking units.

The present invention is not limited to the embodiment described above, and it may be modified in various manners. For example, in the embodiment described above, the second interface station transfer mechanism 22 is used to transfer wafers W into the cleaning units (PIR) in the interface station 13, but the first interface station transfer mechanism 21 may be used for the same purpose. In the embodiment described above, the number of transfer mechanisms is two, but this is not limiting, and the number may be three of more. In the embodiment described above, the present invention is applied to a coating/developing apparatus for an immersion light exposure apparatus, but this is not limiting.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating/developing apparatus for applying a resist liquid onto a substrate to form a resist film, and performing a developing process on the resist film after a light exposure process is performed thereon by a light exposure apparatus, the coating/developing apparatus comprising:

a process section including a plurality of processing units configured to perform a series of processes for resist coating and development;

an interface section disposed between the process section and the light exposure apparatus, and configured to transfer the substrate to and from the light exposure apparatus;

a main transfer mechanism configured to transfer the substrate in the process section;

an interface section transfer mechanism configured to transfer the substrate in the interface section; and a control section configured to control transfer of the substrate, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, the interface section further includes a relay position configured to place thereon the substrate transferred by the second transfer mechanism, and to allow the first transfer mechanism to receive the substrate therefrom, and the control section is arranged to set the substrate on standby at the relay position and the waiting position of each post-exposure baking unit, so as to make a time period constant among substrates from an end of the light exposure process performed by the light exposure apparatus to a start of a post-exposure baking process performed by the post-exposure baking unit.

2. The coating/developing apparatus according to claim 1, wherein the control section is arranged to determine a waiting time of the substrate at the relay position to make a time period constant from a time when the substrate is permitted to be unloaded from the light exposure apparatus to a time when the substrate is transferred onto the relay position by the second transfer mechanism, and to determine a waiting time of the substrate at the waiting position of each post-exposure baking unit to make a time period constant from a time when the first transfer mechanism is permitted to access the relay position to a time when heating is started on the substrate transferred by the first transfer mechanism in one of the post-exposure baking units.

3. The coating/developing apparatus according to claim 2, wherein the control section is arranged to use, as the waiting time of the substrate at the relay position, a value obtained by subtracting an actual time from a longest time in terms of a time period from a time when the substrate is permitted to be unloaded from the light exposure apparatus to a time when the substrate is transferred onto the relay position by the second transfer mechanism, and to use, as the waiting time of the substrate at the waiting position of each post-exposure baking unit, a value obtained by subtracting an actual time from a longest time in terms of a time period from a time when the first transfer mechanism is permitted to access the relay position to a time when heating is started on the substrate transferred by the first transfer mechanism in one of the post-exposure baking units.

4. The coating/developing apparatus according to claim 1, wherein the interface section includes a periphery light exposure unit configured to perform light exposure on an edge portion of a resist film formed on the substrate, and a buffer portion, and the first transfer mechanism is configured to transfer the substrate from the process section into the periphery light exposure unit, and to transfer the substrate onto the buffer portion as needed after a periphery light exposure process.

5. The coating/developing apparatus according to claim 1, wherein the interface section further includes a temperature adjusting unit configured to perform temperature adjustment on the substrate transferred thereon from the process section by the first transfer mechanism, and to allow the second transfer mechanism to transfer the substrate therefrom to the light exposure apparatus.

6. The coating/developing apparatus according to claim 1, wherein the post-exposure baking unit includes a heating plate configured to heat the substrate placed thereon; a cooling plate movable between a cooling position beside the heating plate and a position above the heating plate and configured to transfer the substrate to and from the heating plate and cool the substrate after heating; first lifter pins configured to project and retreat relative to the cooling plate located at the cooling position to transfer the substrate to and from the cooling plate; and second lifter pins configured to project and retreat relative to the heating plate to transfer the substrate to and from the heating plate, and wherein the waiting position is one of positions on the cooling plate, on the first lifter pins in a projected state, and on the second lifter pins in a projected state.

7. A coating/developing apparatus for applying a resist liquid onto a substrate to form a resist film, and performing a developing process on the resist film after an immersion light exposure process is performed thereon by an immersion light exposure apparatus, which is configured to perform light exposure while immersing the resist film in a liquid, the coating/developing apparatus comprising:

a process section including a plurality of processing units configured to perform a series of processes for resist coating and development;

an interface section disposed between the process section and the light exposure apparatus, configured to transfer the substrate to and from the light exposure apparatus, and including a cleaning unit for cleaning the substrate after the immersion light exposure process;

a main transfer mechanism configured to transfer the substrate in the process section;

an interface section transfer mechanism configured to transfer the substrate in the interface section; and a control section configured to control transfer of the substrate, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus and to load and unload the substrate to and from the cleaning unit, the interface section further includes a relay position configured to place thereon the substrate transferred by the second transfer mechanism, and to allow the first transfer mechanism to receive the substrate therefrom, and the control section is arranged to set the substrate on standby at the relay position and the waiting position of each post-exposure baking unit, so as to make a time period constant among substrates from an end of the light exposure process performed by the light exposure apparatus to a start of a post-exposure baking process performed by the post-exposure baking unit.

8. The coating/developing apparatus according to claim 7, wherein the control section is arranged to determine a waiting time of the substrate at the relay position to make a time period constant from a time when the substrate is permitted to be unloaded from the light exposure apparatus to a time when the substrate is transferred onto the relay position from the cleaning unit by the second transfer mechanism after the substrate is transferred into the cleaning unit by the second transfer mechanism and is subjected to a cleaning process in the cleaning unit, and to determine a waiting time of the substrate at the waiting position of each post-exposure baking unit to make a time period constant from a time when the first transfer mechanism is permitted to access the relay position to a time when heating is started on the substrate transferred by the first transfer mechanism in one of the post-exposure baking units.

9. The coating/developing apparatus according to claim 8, wherein the control section is arranged to use, as the waiting time of the substrate at the relay position, a value obtained by subtracting an actual time from a longest time in terms of a time period from a time when the substrate is permitted to be unloaded from the light exposure apparatus to a time when the substrate is transferred onto the relay position from the cleaning unit by the second transfer mechanism after the substrate is transferred into the cleaning unit by the second transfer mechanism and is subjected to a cleaning process in the cleaning unit, and to use, as the waiting time of the substrate at the waiting position of each post-exposure baking unit, a value obtained by subtracting an actual time from a longest time in terms of a time period from a time when the first transfer mechanism is permitted to access the relay position to a time when heating is started on the substrate transferred by the first transfer mechanism in one of the post-exposure baking units.

10. The coating/developing apparatus according to claim 7, wherein the interface section includes a periphery light exposure unit configured to perform light exposure on an edge portion of a resist film formed on the substrate, and a buffer portion, and the first transfer mechanism is configured to transfer the substrate from the process section into the periphery light exposure unit, and to transfer the substrate onto the buffer portion as needed after a periphery light exposure process.

11. The coating/developing apparatus according to claim 7, wherein the interface section further includes a temperature adjusting unit configured to perform temperature adjustment on the substrate transferred thereon from the process section by the first transfer mechanism, and to allow the second transfer mechanism to transfer the substrate therefrom to the light exposure apparatus.

12. The coating/developing apparatus according to claim 7, wherein the post-exposure baking unit includes a heating plate configured to heat the substrate placed thereon; a cooling plate movable between a cooling position beside the heating plate and a position above the heating plate and configured to transfer the substrate to and from the heating plate and cool the substrate after heating; first lifter pins configured to project and retreat relative to the cooling plate located at the cooling position to transfer the substrate to and from the cooling plate; and second lifter pins configured to project and retreat relative to the heating plate to transfer the substrate to and from the heating plate, and wherein the waiting position is one of positions on the cooling plate, on the first lifter pins in a projected state, and on the second lifter pins in a projected state.

13. A substrate transferring method for transferring a light-exposed substrate into a post-exposure baking unit in a coating/developing apparatus for applying a resist liquid onto a substrate to form a resist film, and performing a developing process on the resist film after a light exposure process is performed thereon by a light exposure apparatus, the coating/developing apparatus comprising a process section including a plurality of processing units configured to perform a series of processes for resist coating and development, an interface section disposed between the process section and the light exposure apparatus, and configured to transfer the substrate to and from the light exposure apparatus, a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, and the interface section further includes a relay position configured to place thereon the substrate transferred by the second transfer mechanism, and to allow the first transfer mechanism to receive the substrate therefrom, the method comprising:
performing transfer of the substrate toward one of the post-exposure baking units after the substrate is subjected to the light exposure process by the light exposure apparatus; and
setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

14. The substrate transferring method according to claim 13, wherein the method comprises determining a waiting time of the substrate at the relay position to make a time period constant from a time when the substrate is permitted to be unloaded from the light exposure apparatus to a time when the substrate is transferred onto the relay position by the second transfer mechanism; and determining a waiting time of the substrate at the waiting position of each post-exposure baking unit to make a time period constant from a time when the first transfer mechanism is permitted to access the relay position to a time when heating is started on the substrate transferred by the first transfer mechanism in one of the post-exposure baking units.

15. The substrate transferring method according to claim 14, wherein the method comprises using, as the waiting time of the substrate at the relay position, a value obtained by subtracting an actual time from a longest time in terms of a time period from a time when the substrate is permitted to be unloaded from the light exposure apparatus to a time when the substrate is transferred onto the relay position by the second transfer mechanism; and using, as the waiting time of the substrate at the waiting position of each post-exposure baking unit, a value obtained by subtracting an actual time from a longest time in terms of a time period from a time when the first transfer mechanism is permitted to access the relay position to a time when heating is started on the substrate transferred by the first transfer mechanism in one of the post-exposure baking units.

16. A substrate transferring method for transferring a light-exposed substrate into a post-exposure baking unit in a coating/developing apparatus for applying a resist liquid onto a substrate to form a resist film, and performing a developing process on the resist film after an immersion light exposure process is performed thereon by an immersion light exposure apparatus, which is configured to perform light exposure while immersing the resist film in a liquid, the coating/developing apparatus comprising a process section including a plurality of processing units configured to perform a series of processes for resist coating and development, an interface section disposed between the process section and the light exposure apparatus, configured to transfer the substrate to and from the light exposure apparatus, and including a cleaning unit for cleaning the substrate after the immersion light exposure process, and a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus and to load and unload the substrate to and from the cleaning unit, and the interface section further includes a relay position configured to place thereon the substrate transferred by the second transfer mechanism, and to allow the first transfer mechanism to receive the substrate therefrom, the method comprising:
performing transfer of the substrate toward one of the post-exposure baking units after the substrate is subjected to the light exposure process by the light exposure apparatus; and
setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

17. The substrate transferring method according to claim 16, wherein the method comprises determining a waiting time of the substrate at the relay position to make a time period constant from a time when the substrate is permitted to be unloaded from the light exposure apparatus to a time when the substrate is transferred onto the relay position from the cleaning unit by the second transfer mechanism after the substrate is transferred into the cleaning unit by the second transfer mechanism and is subjected to a cleaning process in the cleaning unit; and determining a waiting time of the substrate at the waiting position of each post-exposure baking unit to make a time period constant from a time when the first transfer mechanism is permitted to access the relay position to a time when heating is started on the substrate transferred by the first transfer mechanism in one of the post-exposure baking units.

18. The substrate transferring method according to claim 17, wherein the method comprises using, as the waiting time of the substrate at the relay position, a value obtained by subtracting an actual time from a longest time in terms of a time period from a time when the substrate is permitted to be unloaded from the light exposure apparatus to a time when the substrate is transferred onto the relay position from the cleaning unit by the second transfer mechanism after the substrate is transferred into the cleaning unit by the second transfer mechanism and is subjected to a cleaning process in the cleaning unit; and using, as the waiting time of the substrate at the waiting position of each post-exposure baking unit, a value obtained by subtracting an actual time from a longest time in terms of a time period from a time when the first transfer mechanism is permitted to access the relay position to a time when heating is started on the substrate transferred by the first transfer mechanism in one of the post-exposure baking units.

19. A storage medium that stores a computer program for transferring a light-exposed substrate into a post-exposure baking unit in a coating/developing apparatus for applying a resist liquid onto a substrate to form a resist film, and performing a developing process on the resist film after a light exposure process is performed thereon by a light exposure apparatus, the coating/developing apparatus comprising a process section including a plurality of processing units configured to perform a series of processes for resist coating and development, an interface section disposed between the process section and the light exposure apparatus, and configured to transfer the substrate to and from the light exposure apparatus, a main transfer mechanism configured to transfer the substrate in the process section, and an interface section transfer mechanism configured to transfer the substrate in the interface section, wherein the process section includes a plurality of post-exposure baking units each having a waiting position and configured to perform a baking process on the substrate after the light exposure process and before the developing process, the interface section transfer mechanism includes a first transfer mechanism configured to transfer the substrate to and from the process section and to load the substrate into one of the post-exposure baking units after the light exposure process, and a second transfer mechanism configured to transfer the substrate to and from the light exposure apparatus, and the interface section further includes a relay position configured to place thereon the substrate transferred by the second transfer mechanism, and to allow the first transfer mechanism to receive the substrate therefrom, the computer program, when executed, causing the computer to control the first and second transfer mechanisms to execute: performing transfer of the substrate toward one of the post-exposure baking units after the substrate is subjected to the light exposure process by the light exposure apparatus; and setting the substrate on standby during the transfer at the relay position and the waiting position of each post-exposure baking unit, so as to make a time period constant among substrates from an end of the light exposure process performed by the light exposure apparatus to a start of a post-exposure baking process performed by the post-exposure baking unit.

20. The storage medium according to claim 19, wherein the computer program is arranged to determine a waiting time of the substrate at the relay position to make a time period constant from a time when the substrate is permitted to be unloaded from the light exposure apparatus to a time when the substrate is transferred onto the relay position by the second transfer mechanism, and to determine a waiting time of the substrate at the waiting position of each post-exposure baking unit to make a time period constant from a time when the first transfer mechanism is permitted to access the relay position to a time when heating is started on the substrate transferred by the first transfer mechanism in one of the post-exposure baking units.

21. The storage medium according to claim 20, wherein the computer program is arranged to use, as the waiting time of the substrate at the relay position, a value obtained by subtracting an actual time from a longest time in terms of a time period from a time when the substrate is permitted to be unloaded from the light exposure apparatus to a time when the substrate is transferred onto the relay position by the second transfer mechanism, and use, as the waiting time of the substrate at the waiting position of each post-exposure baking unit, a value obtained by subtracting an actual time from a longest time in terms of a time period from a time when the first transfer mechanism is permitted to access the relay position to a time when heating is started on the substrate transferred by the first transfer mechanism in one of the post-exposure baking units.

* * * * *